US009917215B2

(12) United States Patent
Chen et al.

(10) Patent No.: US 9,917,215 B2
(45) Date of Patent: *Mar. 13, 2018

(54) DOUBLE LAYERED TRANSPARENT CONDUCTIVE OXIDE FOR REDUCED SCHOTTKY BARRIER IN PHOTOVOLTAIC DEVICES

(71) Applicants: INTERNATIONAL BUSINESS MACHINES CORPORATION, Armonk, NY (US); Bay Zu Precision Co., LTD., Tainan (TW)

(72) Inventors: Shun-Ming Chen, Tainan (TW); Chien-Chih Huang, Pingtung (TW); Joel P. Desouza, Putnam Valley, NY (US); Augustin J. Hong, White Plains, NY (US); Jeehwan Kim, White Plains, NY (US); Chien-Yeh Ku, Tainan (TW); Devendra K. Sadana, Pleasantville, NY (US); Chuan-Wen Wang, Tainan (TW)

(73) Assignees: INTERNATIONAL BUSINESS MACHINES CORPORATION, Armonk, NY (US); BAY ZU PRECISION CO., LTD., Tainan (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/189,925

(22) Filed: Jun. 22, 2016

(65) Prior Publication Data

US 2016/0300965 A1    Oct. 13, 2016

Related U.S. Application Data

(63) Continuation of application No. 13/668,941, filed on Nov. 5, 2012, now Pat. No. 9,379,259.

(51) Int. Cl.
H01L 31/075 (2012.01)
H01L 31/0224 (2006.01)
(Continued)

(52) U.S. Cl.
CPC ........... H01L 31/022483 (2013.01); H01L 31/022425 (2013.01); H01L 31/03921 (2013.01);
(Continued)

(58) Field of Classification Search
CPC .......... H01L 31/022483; H01L 31/075; H01L 31/1884; H01L 31/022425; H01L 31/03921; Y02E 10/548
See application file for complete search history.

(56) References Cited

U.S. PATENT DOCUMENTS 5,078,803 A    1/1992  Pier et al.
5,527,716 A    6/1996  Kusian et al.
(Continued)

OTHER PUBLICATIONS

Ratcliff et al., "Work function control of hole-selective polymer/ITO anode contacts: an electrochemical doping study", Journal of materials Chemistry, 2010, 20, 2672-2679.*
(Continued)

Primary Examiner — Jarrett Stark
Assistant Examiner — Charles N Ausar-El
(74) Attorney, Agent, or Firm — Tutunjian & Bitetto, P.C.; Louis J. Percello

(57) ABSTRACT

A device and method for fabricating a photovoltaic device includes forming a double layer transparent conductive oxide on a transparent substrate. The double layer transparent conductive oxide includes forming a doped electrode layer on the substrate, and forming a buffer layer on the doped electrode layer. The buffer layer includes an undoped or p-type doped intrinsic form of a same material as the
(Continued)

doped electrode layer. A light-absorbing semiconductor structure includes a p-type semiconductor layer on the buffer layer, an intrinsic layer and an n-type semiconductor layer.

20 Claims, 6 Drawing Sheets

(51) Int. Cl.
  *H01L 31/0392* (2006.01)
  *H01L 31/18* (2006.01)
(52) U.S. Cl.
  CPC ........ *H01L 31/075* (2013.01); *H01L 31/1884* (2013.01); *Y02E 10/548* (2013.01)

(56) References Cited

U.S. PATENT DOCUMENTS

| | | | |
|---|---|---|---|
| 5,956,572 A | 9/1999 | Kidoguchi et al. | |
| 5,990,416 A * | 11/1999 | Windisch, Jr. | H01L 31/1884 136/255 |
| 6,040,521 A | 3/2000 | Kushiya et al. | |
| 6,974,976 B2 * | 12/2005 | Hollars | C23C 14/0057 136/264 |
| 7,718,091 B2 | 5/2010 | Zijp et al. | |
| 8,026,438 B2 | 9/2011 | Keshner et al. | |
| 8,421,195 B2 * | 4/2013 | Rao | H01L 27/11521 257/611 |
| 8,647,916 B2 * | 2/2014 | Kim | H01L 31/0749 136/256 |
| 2008/0289953 A1 * | 11/2008 | Hollars | C23C 14/0623 204/192.1 |
| 2010/0089444 A1 * | 4/2010 | Thomsen | H01L 31/022466 136/256 |
| 2010/0096007 A1 | 4/2010 | Mattmann et al. | |
| 2011/0120554 A1 * | 5/2011 | Chhajed | C09D 1/00 136/259 |
| 2011/0146769 A1 * | 6/2011 | Hoffbauer | C08J 7/123 136/255 |
| 2012/0031479 A1 | 2/2012 | Kress et al. | |
| 2012/0048364 A1 | 3/2012 | Auvray et al. | |
| 2012/0055534 A1 * | 3/2012 | Leschkies | H01L 31/022466 136/244 |
| 2013/0081688 A1 * | 4/2013 | Liang | H01L 31/022425 136/256 |
| 2013/0221373 A1 * | 8/2013 | Chen | H01L 31/075 257/77 |
| 2013/0221464 A1 * | 8/2013 | Fogel | H01L 31/022466 257/432 |
| 2013/0224899 A1 * | 8/2013 | Abou-Kandil | H01L 31/02167 438/72 |
| 2013/0298971 A1 * | 11/2013 | Chen | C23C 16/50 136/252 |
| 2014/0305486 A1 * | 10/2014 | Kondo | H01L 31/043 136/244 |
| 2015/0295099 A1 * | 10/2015 | Leschkies | H01L 31/022466 136/246 |

OTHER PUBLICATIONS

Ruckh, M., et al. "Applications of ZnO in Cu(In,Ga)Se2 Solar Cells" Conference Record of the Twenty Fifth IEEE Photovoltaic Specialists Conference. May 1996. pp. 825-828.

Zhao, Z., et al. "Low-Cost High-Performance Transparent Conducting Oxide Films Fabricated by Combustion Chemical Vapor Deposition" Society of Vacuum Coaters 45th Annual Technical Conference. Apr. 2002. pp. 274-279.

* cited by examiner

DOUBLE LAYERED TRANSPARENT CONDUCTIVE OXIDE FOR REDUCED SCHOTTKY BARRIER IN PHOTOVOLTAIC DEVICES

BACKGROUND

Technical Field

The present invention relates to photovoltaic devices, and more particularly to photovoltaic devices and methods having a double layer transparent conductive oxide to reduce barrier height.

Description of the Related Art

A solar cell may be formed on a glass substrate and may include an electrode (metal) formed in contact with a p-type layer (semiconductor). The electrode may include a transparent film that is conductive, or a transparent conductive oxide (TCO). Currently developed TCOs are n-type since p-type states of TCO are thermodynamically unstable. A Schottky barrier exits between the p-type layer and the TCO. The Schottky barrier is a potential barrier formed at a metal-semiconductor junctions which has rectifying characteristics. The Schottky barrier has a decreased depletion width in the metal. Rectifying properties depend on the metal's work function, the band gap of the intrinsic semiconductor, the type and concentration of dopants in the semiconductor, and other factors.

The Schottky barrier forms as a result of the materials in contact (n-type metal and n-type semiconductor). Due to the n-type nature of TCO, the Schottky barrier always exists at the interface between the p-type semiconductor and TCO. The Schottky barrier at this location in undesirable and degrades performance.

SUMMARY

A device and method for fabricating a photovoltaic device includes forming a double layer transparent conductive oxide on a transparent substrate. The double layer transparent conductive oxide includes forming a doped electrode layer on the substrate, and forming a buffer layer on the doped electrode layer. The buffer layer includes an undoped or p-type doped form of a same material as the doped electrode layer. A light-absorbing semiconductor structure includes a p-type semiconductor layer on the buffer layer, an intrinsic layer and an n-type semiconductor layer.

A method for fabricating a photovoltaic device includes forming a double layer transparent conductive oxide on a transparent substrate including sputtering on a doped electrode layer on the substrate using a first target source; switching to a second target source; and sputtering on a buffer layer including an undoped or p-type doped form of a same material as the doped electrode layer on the doped electrode layer using the second target source; and forming a light-absorbing semiconductor structure including a p-type semiconductor layer on the buffer layer, an intrinsic layer and an n-type semiconductor layer.

Another method for fabricating a photovoltaic device includes forming a double layer transparent conductive oxide on a transparent substrate including: depositing a doped electrode layer on the substrate using a low pressure chemical vapor deposition (LPCVD) process; and forming a buffer layer including an undoped or p-type doped form of a same material as the doped electrode layer on the doped electrode layer using the LPCVD process by reducing dopant concentration to zero; and forming a light-absorbing semiconductor structure including a p-type semiconductor layer on the buffer layer, an intrinsic layer and an n-type semiconductor layer.

A photovoltaic device includes a transparent substrate and a double layer transparent conductive oxide formed on the substrate. The double layer includes a doped electrode layer formed on the substrate and a buffer layer formed on the doped electrode layer. The buffer layer includes an undoped or p-type doped form of a same material as the doped electrode layer. A light-absorbing semiconductor structure includes a p-type semiconductor layer on the buffer layer, an intrinsic layer and an n-type semiconductor layer.

Another photovoltaic device includes a glass substrate, and a double layer transparent conductive oxide formed on the substrate. The double layer includes a doped ZnO layer formed on the substrate and an undoped or p-type doped ZnO buffer layer formed on the doped electrode layer. A light-absorbing semiconductor structure includes a p-type semiconductor layer on the buffer layer, an intrinsic layer and an n-type semiconductor layer, the buffer layer having a work function value between values of work functions of the doped ZnO layer and the p-type semiconductor layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
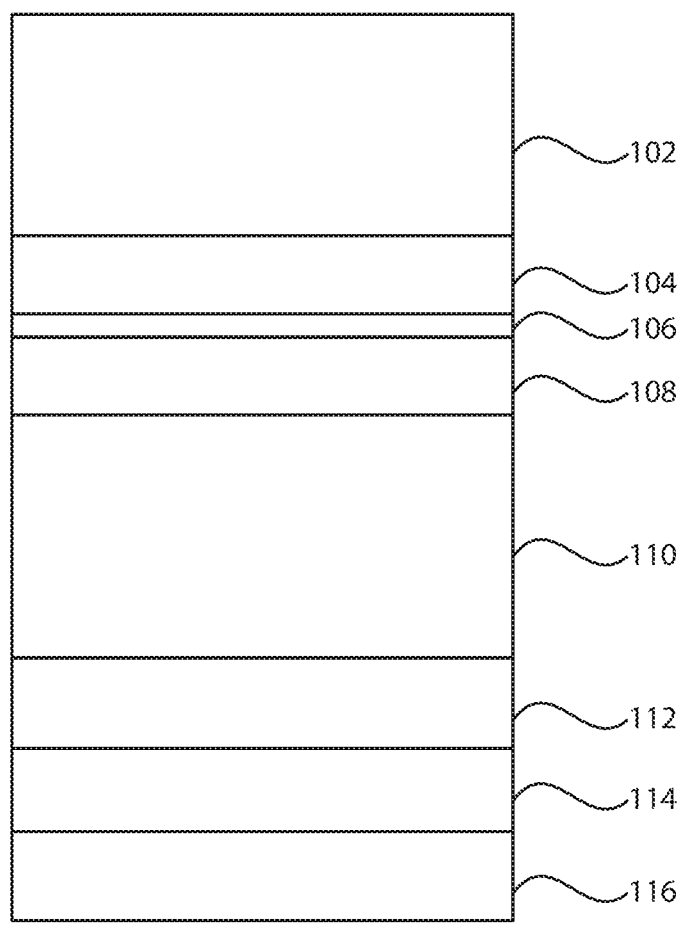
FIG. 1 is a cross-sectional view showing a solar cell with an undoped or p-type doped buffer layer in accordance with one embodiment.

In accordance with the present principles, photovoltaic devices having improved fill factor are provided. The photovoltaic devices may include a solar cell or other light sensitive device. In addition, methods for forming the solar cell or light sensitive devices with improved fill factor are disclosed. The solar cell reduces effects of the formation of a Schottky barrier by providing an intrinsic transparent conductive oxide between a contact and a semiconductor layer. Normally, the contact is a transparent conductive oxide (TCO), which permits light to be transmitted there-through. In accordance with one illustrative embodiment, an additional layer of transparent conductive material is employed to form an ohmic contact or to reduce a Schottky barrier between the contact and the semiconductor material. The transparent conductive material is formed in an intrinsic form as a thin layer or is p-type doped. The additional layer of transparent conductive material acts as an ohmic contact to reduce or eliminate any Schottky effect or barrier. This improves the fill factor by improving short circuit current ($J_{sc}$) of the device.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., SiC, ZnO, etc. These compounds include different proportions of the elements within the compound, e.g., SiC includes $Si_xC_{1-x}$, where x is less than or equal to 1, or ZnO includes $Zn_xO_{1-x}$ where x is less than or equal to 1, etc. In addition, other elements may be included in the compound, such as, e.g., SiC:H, and still function in accordance with the present principles.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc. It is also to be understood that the present principles are applicable to tandem or multi junction structures.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors or other photovoltaic applications. Structure 100 includes a substrate 102 that permits a high-transmittance of light. The substrate 102 may include a transparent material, such as glass, a polymer, etc. or combinations thereof. A first electrode 104 includes a transparent conductive material. Electrode 104 preferably includes n-type material/dopants. Electrode 104 preferably includes a transparent conductive oxide (TCO), such as, e.g., doped zinc oxide (e.g., ZnO:Al or ZnO:B) although other TCOs may be employed, e.g., a fluorine-doped tin oxide ($SnO_2$:F, or "FTO"), indium tin oxide (ITO) or other suitable materials. For the present example, a doped zinc oxide is illustratively employed for electrode 104. The TCO electrode 104 permits light to pass through to an active light-absorbing material beneath and allows conduction to transport photo-generated charge carriers away from that light-absorbing material.

In accordance with the present principles, a buffer layer 106 is formed on the electrode 104 to act as an interface with a semiconductor layer 108 to avoid or reduce the formation of a diode-like Schottky barrier. In one embodiment, the buffer layer 106 includes a transparent conductive oxide having a different doping concentration from that of the TCO electrode 104. The buffer layer 106 may include a same material as the TCO electrode 104, but be processed or deposited in a different way so that a difference in work function between the TCO electrode 104 and the semiconductor layer 108 is reduced.

Although making p-type TCO is difficult, reducing n-doping and adding p-type dopants increases the work function of the TCO. However, the p-type TCO cannot be employed with the entire thickness since sheet resistance is too high. Therefore, a heavily n-type doped TCO (TCO electrode 104) can be employed to have low sheet resistance and a thin layer (buffer layer 106) of a high work function is employed with undoped or p-doped TCO.

In accordance with the present principles, the contact barrier problem is reduced or avoided by providing a material for layer 106 that has a high work function (e.g., highly conductive) or at least closer to the work function of the TCO electrode 104. Layer 106 may include a TCO material of between about 100 nm and 500 nm, although a thinner layer may be employed. The layer 106 provides a higher work function to assist in reducing any contact barrier.

Figure 2:
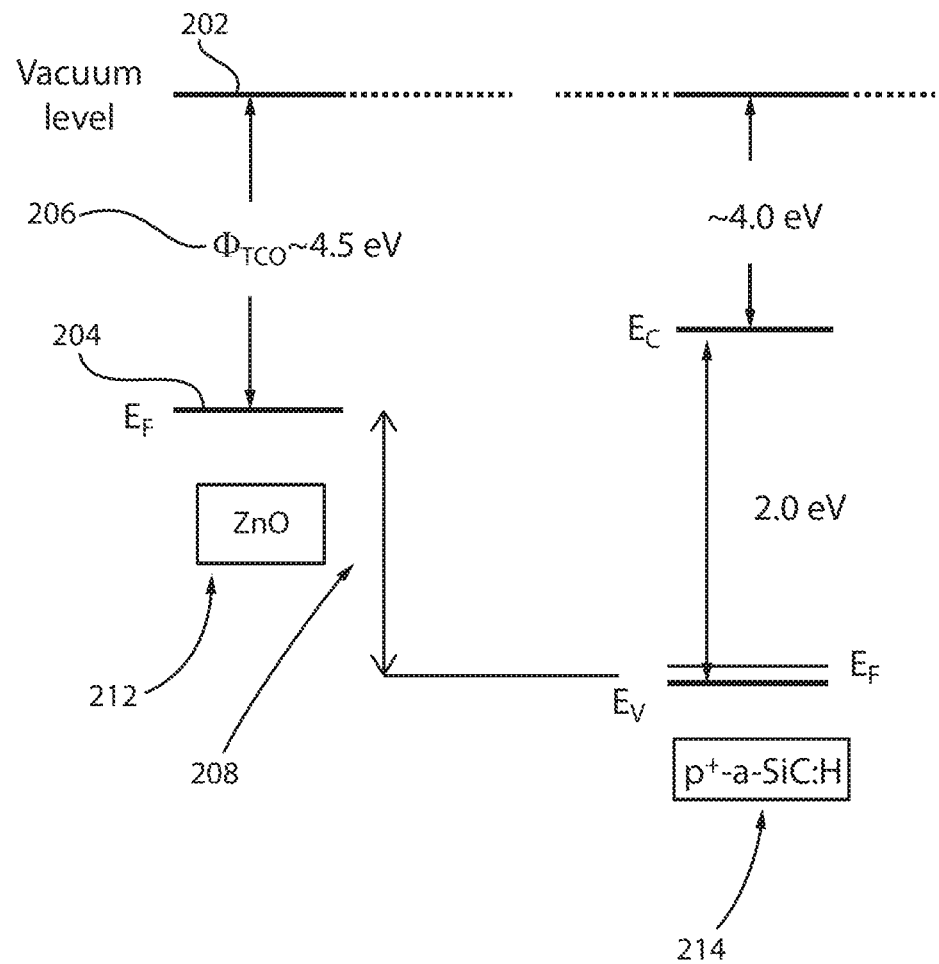
FIG. 2 is an energy diagram showing a Schottky barrier targeted to be eliminated or reduced in accordance with the present principles.

Referring to FIG. 2, an energy chart shows a barrier 208 formed between a work function 206 of a ZnO (TCO electrode 212) (about 4.5 eV) and a work function 210 for a p+a-SiC:H layer (semiconductor 214) (about 6 eV). The barrier 208 is approximately 1.5 eV. This barrier is reduced by the introduction of the buffer layer 106 in accordance with the present principles.

It should be noted that the TCO electrode 212 is an n-type material while the semiconductor 214 is p-type doped material. To overcome the barrier 208, the work functions of the adjacent materials need to be more gradually transitioned. P-doping the ZnO of the TCO electrode is fundamentally difficult since the resulting material is thermodynamically unstable. Further, employing an undoped ZnO for TCO electrode 212 could be made to yield a work function equal to about 6 eV (about equal to the semiconductor material 214); however, undoped ZnO cannot be employed due to its high resistivity. Ec denotes a conduction band for the semiconductor material 214, and Ev denotes a valance band for the semiconductor material 214.

These difficulties may be overcome by employing a combination of thin intrinsic material and using gradually increasing p-doping to increase stability and beneficially modify the work function. The present principles balance conductivity and work function to provide a buffer layer that is sufficiently conductive through doping and provides a transitional work function between the doped transparent electrode and the p-doped semiconductor layer in a photovoltaic cell.

Referring again to FIG. 1, in accordance with the present principles, the buffer layer 106 may include a gradient doping profile which includes a higher n-type dopant concentration adjacent to the electrode 104 and a lower n-type dopant concentration near the semiconductor layer 108 (or a graduation of dopant types n to p). In another embodiment, the buffer layer 106 includes a same material as the TCO electrode 104 but includes a lower n-type dopant concentration. In still another embodiment, the buffer layer 106 includes a same material as the TCO electrode 104, which is thin and remains undoped (intrinsic) or includes p-type dopants in a thin portion. In another embodiment, the buffer layer includes an n-type dopant gradient and a p-type dopant gradient throughout the buffer layer 106. For example, the n-type gradient is reduced with distance from the TCO electrode 104 and the p-type gradient begins as an intermediate position in the buffer layer 106 and increases with distance from the TCO electrode 104. In one embodiment, the n-type dopants may start at the dopant concentration of the TCO electrode 104 and decrease to zero within the buffer layer 106. In another embodiment, the p-type dopants may start at zero dopant concentration within the buffer layer 106 and increase to the p-type layer (108) dopant concentration. An intrinsic zone (undoped portion) of the buffer layer may be present (e.g., between n and p dopant concentrations or before beginning n or p dopant concentration region(s) within the buffer layer 106). Other dopant concentrations are also contemplated.

The light-absorbing material includes a p-type semiconductor layer 108. An intrinsic layer 110 is formed on layer 108. Intrinsic layer 110 is undoped. An n-type layer 112 is formed on the intrinsic layer 110. The N-type layer 112 is in contact with a first back-reflector 114. The back-reflector 114 may be in contact with a second back-reflector 116. One of both of the back-reflectors 114 and 116 functions as a second electrode.

The structure 100 is preferably a silicon thin-film cell, which includes silicon layers which may be deposited by a chemical vapor deposition (CVD) process, or a plasma-enhanced (PE-CVD)) from silane gas and hydrogen gas. Depending on the deposition parameters, amorphous silicon (a-Si or a-Si:H), nanocrystalline silicon (nc-Si or nc-Si:H), and/or microcrystalline silicon μc-Si:H may be formed.

In one embodiment, structure 100 includes ZnO:Al for electrode 104, and P-type amorphous and/or microcrystalline silicon carbon (p+μc)-SiC:H for layer 108. Intrinsic layer 110 includes amorphous silicon (a-Si:H), and layer 112 includes an N-type amorphous silicon (a-Si:H). The first back reflector 114 may include a transparent oxide, such as, ZnO, and the second back reflector 116 preferably includes a highly reflective material, such as silver (Ag), chromium (Cr), etc.

Figure 3A:
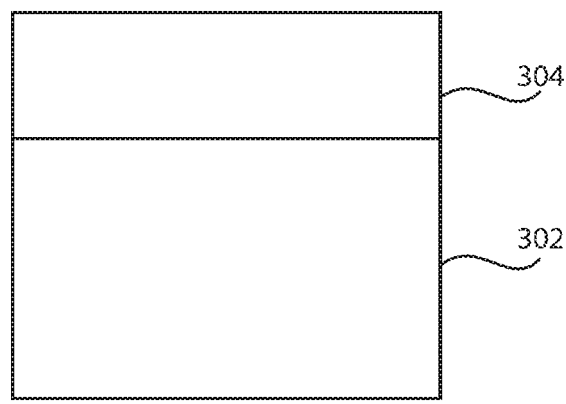
FIGS. 3A-3C are cross-sectional views showing fabrication of a solar cell using a sputtering process in accordance with the present principles.
Figure 3B:
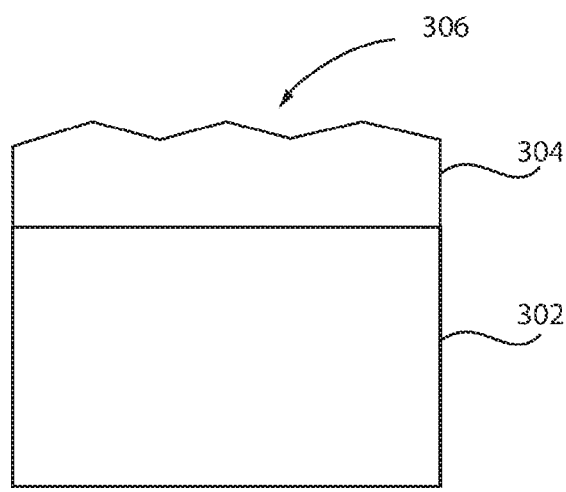
Figure 3C:
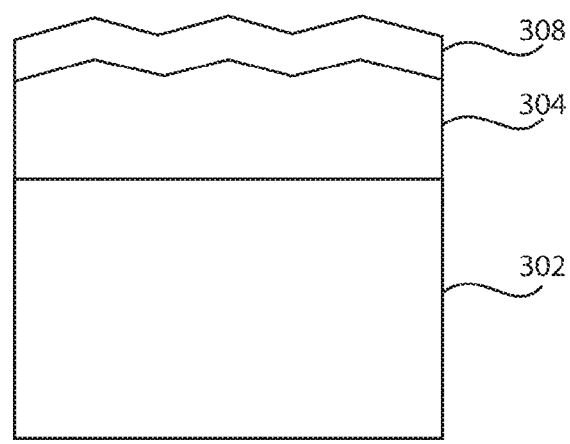

Referring to FIGS. 3A-3C, method steps for forming the buffer layer 106 in accordance with one embodiment are illustratively shown. In FIG. 3A, a transparent substrate 302, e.g., glass, is provided. A transparent conductive oxide (TCO) 304, such as ZnO is deposited by physical vapor deposition process, e.g., sputtering. In this example, the TCO 304 includes ZnO and is preferably highly doped with Al (e.g., ZnO:Al). In FIG. 3B, the TCO 304 is textured by wet etching the TCO 304 to form a textured surface 306 (e.g., a pyramidal surface). In FIG. 3C, the sputtering target is changed to an intrinsic ZnO target, and an intrinsic and/or p-doped layer 308 of ZnO is deposited on the textured surface 306 (to form the buffer layer 106). A p-type source may also be employed to provide p-type dopants for layer 306. The p-type profile may be graduated.

Figure 4A:
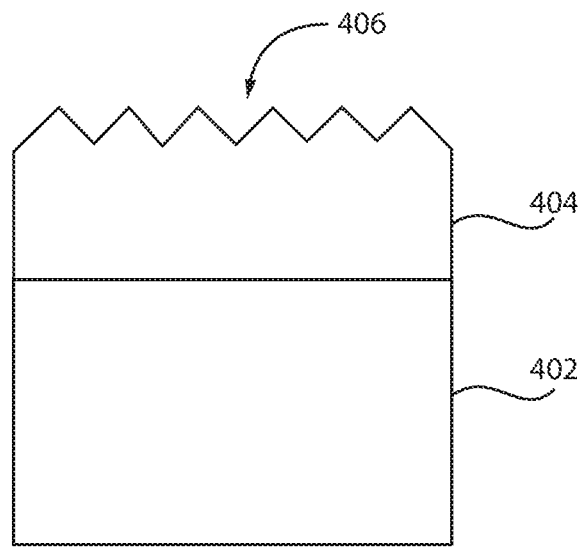
FIGS. 4A-4B are cross-sectional views showing fabrication of a solar cell using a low pressure chemical vapor deposition (LPCVD) in accordance with the present principles.
Figure 4B:
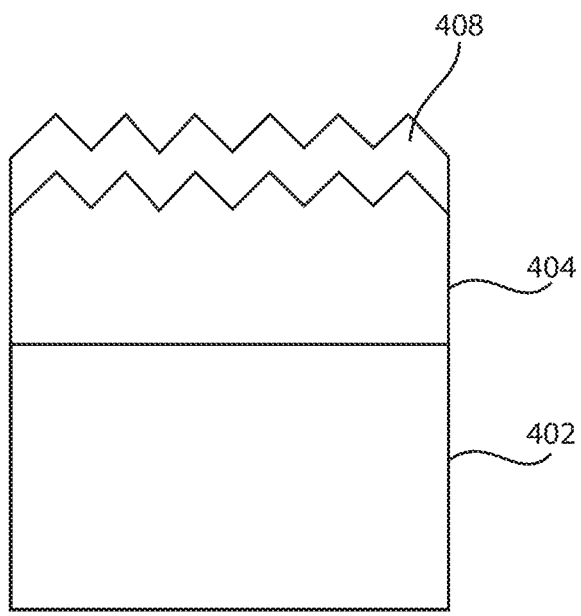

Referring to FIGS. 4A-4B, method steps for forming the buffer layer 106 in accordance with another embodiment are illustratively shown. In FIG. 4A, a transparent substrate 402, e.g., glass, is provided. A TCO 404, such as ZnO, is deposited by physical vapor deposition process, e.g., low pressure chemical vapor deposition (LPCVD). In this example, the TCO 404 includes ZnO and is preferably highly doped with B (e.g., ZnO:B). The doping with B is performed in-situ during the formation of the TCO 404. During the formation process, a pyramidal surface 406 is automatically formed. As the formation process continues, the B gas concentration may be reduced to zero and an undoped (intrinsic) or p-type doped buffer layer 408 is formed as shown in FIG. 4B.

In one embodiment; during the process a glass temperature is controlled between about 150 and 16.5° C. and the chamber pressure is kept about 0.6 Torr. Diethylzinc (DEZ) is used as precursor which reacts with $H_2O$ to form ZnO. Diluted $B_2H_6$ is used as dopant gas with $B_2H_6$/DEZ ratio ranging from 4 to 0 to obtain high optical transmittance and a low Schottky resistance double layer TCO.

Table I shows a comparison between the a single layer LPCVD deposited ZnO (LPZnO) TCO layer with high doping, a double layer LPZnO with a high doping layer and an intrinsic layer in accordance with the present principles. Table I includes fill factor (FF). FF is a ratio of the maximum power point ($P_m$) divided by open circuit voltage ($V_{oc}$) and short circuit current ($J_{sc}$): FF=$P_m/V_{oc}J_{sc}$. The fill factor is directly affected by the values of a cell's series and shunt resistance. Increasing the shunt resistance ($R_{sh}$) and decreasing the series resistance (Rs) will lead to a higher fill factor, thus resulting in greater efficiency, and pushing the cells output power closer towards its theoretical maximum.

TABLE I

| SUBSTRATE: | Efficiency | FF | Voc | Jsc |
|---|---|---|---|---|
| Single layer LPZnO | 6.01 | 61.55 | 753.90 | 13.19 |
| Double layer LPZnO | 6.72 | 68.94 | 739.69 | 13.17 |

Employing the buffer layer, e.g., the double layer TCO, significantly increases efficiency and FF. Note that the results provided in Table I are illustrative and greater improvements are contemplated depending on the device design. Using the double layer TCO in accordance with the present principles can reduce the Schottky barrier by about 1 eV or more.

Figure 5:
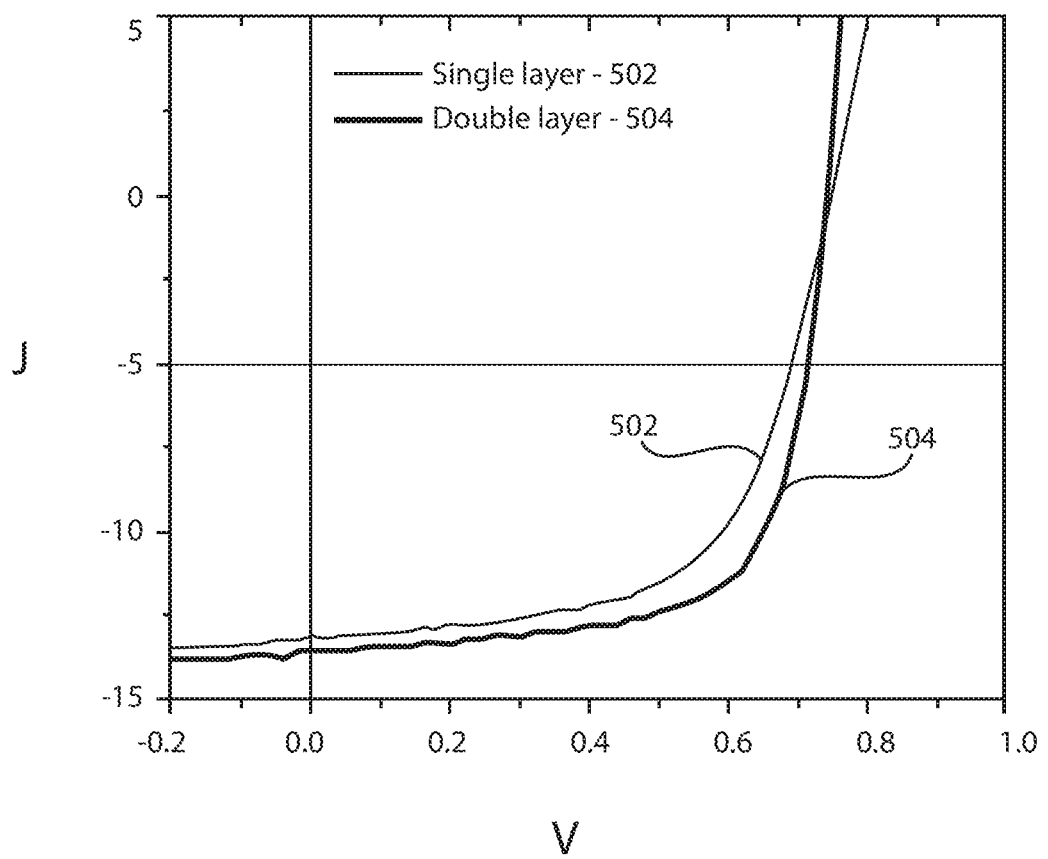
FIG. 5 is a graph showing current, J, (in mA) versus voltage, V, (in volts) for both a single layered transparent conductive oxide layer and a double layered transparent conductive oxide layer in accordance with the present principles.

Referring to FIG. 5, a graph of current (J) in mA versus voltage (V) in volts shows a plot 502 of a single layer TCO and a plot 504 of a double layer TCO in accordance with the present principles. In both the single layer case and the double layer case, the amount of carbon present was minimized. The single layer TCO (502) resulted in FF being about 62% as shown in Table I. The double layer TCO (504) includes a low pressure CVD deposited highly doped TCO layer and a thin intrinsic low pressure CVD layer formed thereon. The double layer TCO (504) resulted in FF being about 69% as shown in Table I. An approximate difference of 7% in FF is significant in solar cell technology.

Figure 6:
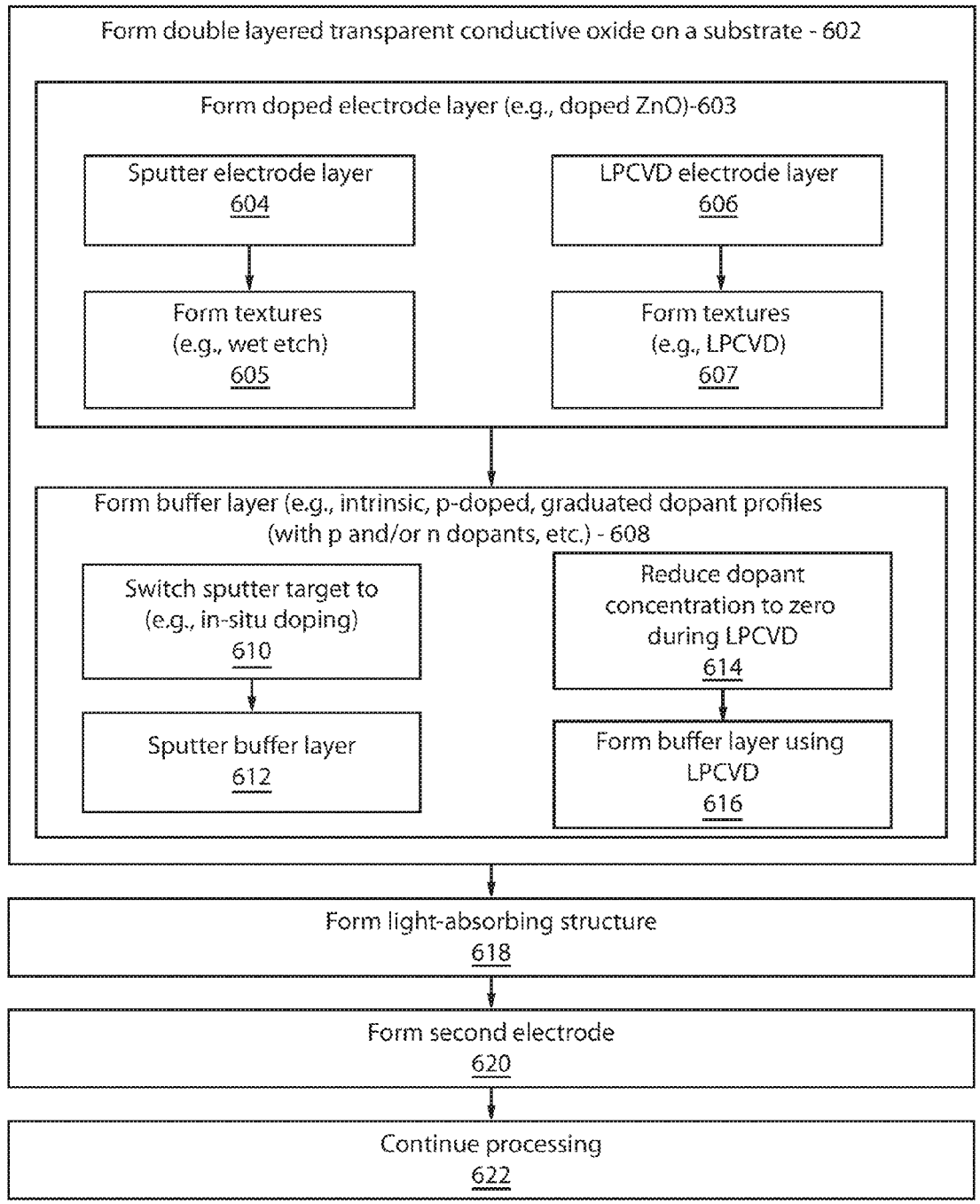
FIG. 6 is a block/flow diagram showing methods for fabricating a photovoltaic device in accordance with illustrative embodiments.

Referring to FIG. 6, methods for forming a double layer transparent conductive oxide is shown in accordance with the present principles. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 602, a double layer transparent conductive oxide is formed on a transparent substrate. The double layer may be formed in accordance with a plurality of different processes. In one illustrative process, a doped electrode layer is formed on the substrate in block 603. The doped electrode layer may include ZnO doped with Al or B, although other materials may be employed, e.g. FTO, ITO, etc. In block 604, the doped electrode layer may be formed by sputtering using a first target source. The target source may include dopants or an additional dopant source may be employed. In block 605, an optional etch, such as a wet etch with diluted HCl or other acids may be employed to form a texture surface (e.g., a three-dimensional structure with pyramidal structures) on the doped electrode layer. In block 606, another embodiment forms the doped electrode layer on the substrate using a low pressure chemical vapor deposition (LPCVD) process. In block 607, a textured surface may be formed by employed the LPCVD process to form pyramidal structures.

In block 608, a buffer layer is formed on the doped electrode layer. The buffer layer preferably includes an undoped (intrinsic) or p-doped form of a same material as the doped electrode layer. The buffer layer includes a work function having a value between the values of work functions of adjacent layers, e.g., the TCO electrode layer and a semiconductor layer of the light-absorbing structure. The buffer layer may include a thin intrinsic layer (e.g., 5 nm-200 nm), may include a reduced n-type doping profile (less than the doped electrode layer or gradually decreasing from the doped electrode layer), may include an intrinsic layer with p-type dopants increasing from the doped electrode layer, may include the reduced n-type doping profile and increased p-type dopant from the doped electrode layer, etc.

In block 610, if sputtering is employed, the sputtering source is switched to a second target source (to form the intrinsic or p-type buffer layer) or both target sources are employed and controlled to obtain the desired dopant profile. This is preferably performed in-situ so a same processing chamber may be employed for the entire double layer without having to open up the chamber to remove the device being fabricated. In block 612, a buffer layer is sputtered on the doped electrode layer. The buffer layer may include the intrinsic or p-type doped form (or form with n-type dopants) of the material employed for the doped electrode layer. The buffer layer may include a thickness of between about 100 nm and 500 nm, although thinner layers may also be employed.

In block 614, if the LPCVD process is employed, at a point in the formation of the doped electrode layer, the dopant (n-type) concentration is gradually reduced to zero. P-type dopant may be ramped up. In block 616, the buffer layer is formed which includes a portion of the intrinsic form of the same material as the doped electrode layer using the LPCVD process. The buffer layer may include a thickness of between about 100 nm and 500 nm, although thinner layers may also be employed. The intrinsic portion may be very thin, e.g., 5-200 nm.

In block 618, a light-absorbing semiconductor structure is formed, which includes a p-type semiconductor layer on the buffer layer, an intrinsic layer and an n-type semiconductor layer. The light-absorbing structure preferably includes a silicon based materials, and the p-type semiconductor layer, the intrinsic layer and the n-type semiconductor layer may include at least one of Si and SiC in different forms.

In block 620, a second electrode may be formed on the light-absorbing semiconductor structure. The second electrode may include one or more layers, which may have back reflection properties, e.g., TCO materials, metals, etc. In block 622, processing continues to complete the device.

Having described preferred embodiments for a double layered transparent conductive oxide for reduced Schottky barrier in photovoltaic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a photovoltaic device, comprising:
    forming a double layer transparent conductive oxide on a transparent substrate including:
        forming a doped electrode layer on the substrate; and
        forming a buffer layer on the doped electrode layer by reducing dopant concentration to zero, the buffer layer including an undoped or p-doped form of a same material as the doped electrode layer; and forming a light-absorbing semiconductor layer including a p-type semiconductor layer on the buffer layer, an intrinsic layer and an n-type semiconductor layer such that a difference in work function between the doped electrode layer and the p-type semiconductor layer is reduced.

2. The method as recited in claim 1, wherein forming a buffer layer includes forming the buffer layer with a work function having a value between values of work functions of adjacent layers.

3. The method as recited in claim 1, wherein the doped electrode layer and the buffer layer include ZnO.

4. The method as recited in claim 1, wherein the buffer layer includes a thickness between about 100 nm and 500 nm.

5. The method as recited in claim 1, further comprising forming a second electrode on the light-absorbing semiconductor structure.

6. The method as recited in claim 1, wherein the p-type semiconductor layer includes at least one of Si and SiC.

7. The method as recited in claim 1, further comprising texturing the double layer to provide a three-dimensional structure.

8. The method as recited in claim 1, wherein the buffer layer includes p-type dopants increasing in concentration from the doped electrode layer.

9. The method as recited in claim 1, wherein the buffer layer includes n-type dopants decreasing in concentration from the doped electrode layer.

10. A method for fabricating a photovoltaic device, comprising:

forming a double layer transparent conductive oxide on a transparent substrate including:

sputtering on a doped electrode layer on the substrate using a first target source;

switching to a second target source in-situ, wherein the photovoltaic device being fabricated remains in a same processing chamber for formation of the entire double layer; and sputtering on a buffer layer including an undoped or p-type doped form of a same material as the doped electrode layer on the doped electrode layer using the second target source; and forming a light-absorbing semiconductor structure including a p-type semiconductor layer on the buffer layer, an intrinsic layer and an n-type semiconductor layer such that a difference in work function between the doped electrode layer and the p-type semiconductor layer is reduced.

11. The method as recited in claim 10, wherein forming a buffer layer includes forming the buffer layer with a work function having a value between values of work functions of adjacent layers.

12. The method as recited in claim 10, wherein the doped electrode layer and the buffer layer include ZnO.

13. The method as recited in claim 10, wherein the buffer layer includes a thickness between about 100 nm and 500 nm.

14. The method as recited in claim 10, further comprising forming a second electrode on the light-absorbing semiconductor structure.

15. The method as recited in claim 10, wherein the p-type semiconductor layer includes at least one of Si and SiC.

16. The method as recited in claim 10, further comprising forming a textured surface on the doped electrode layer.

17. The method as recited in claim 16, wherein forming a textured surface includes wet etching the doped electrode layer to form pyramidal structures.

18. The method as recited in claim 10, wherein the buffer layer includes p-type dopants increasing in concentration from the doped electrode layer.

19. The method as recited in claim 10, wherein the buffer layer includes n-type dopants decreasing in concentration from the doped electrode layer.

20. A method for fabricating a photovoltaic device, comprising:

forming a double layer transparent conductive oxide on a transparent substrate including:

depositing a doped electrode layer on the substrate using a low pressure chemical vapor deposition (LPCVD) process; and forming a buffer layer including an oppositely doped form of a same material as the doped electrode layer on the doped electrode layer using the LPCVD process by reducing dopant concentration to zero; and forming a light-absorbing semiconductor structure including a p-type semiconductor layer on the buffer layer, an intrinsic layer and an n-type semiconductor layer such that a difference in work function between the doped electrode layer and the p-type semiconductor layer is reduced.

* * * * *